United States Patent
Yang et al.

(10) Patent No.: US 6,825,083 B1
(45) Date of Patent: Nov. 30, 2004

(54) METHOD FOR REDUCING SHALLOW TRENCH ISOLATION EDGE THINNING ON THIN GATE OXIDES TO IMPROVE PERIPHERAL TRANSISTOR RELIABILITY AND PERFORMANCE FOR HIGH PERFORMANCE FLASH MEMORY DEVICES

(75) Inventors: Nian Yang, San Jose, CA (US); John Jianshi Wang, San Jose, CA (US); Xin Guo, Mountain View, CA (US); Tien-Chun Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/126,814

(22) Filed: Apr. 19, 2002

(51) Int. Cl.[7] ............................................. H01L 21/336
(52) U.S. Cl. ........................ 438/258; 438/257; 438/275
(58) Field of Search ................................ 438/241, 258, 438/266, 201, 212, 257, 275, 593, 264, 585, 211; 257/326, 239, 314–316

(56) References Cited

U.S. PATENT DOCUMENTS

| | | | | |
|---|---|---|---|---|
| 6,159,799 A | * | 12/2000 | Yu | ............................... 438/257 |
| 6,165,846 A | * | 12/2000 | Carns et al. | ................. 438/264 |
| 6,177,362 B1 | * | 1/2001 | Huang et al. | ................ 438/787 |
| 6,265,267 B1 | * | 7/2001 | Huang | ......................... 438/258 |
| 6,319,780 B2 | * | 11/2001 | Crivelli et al. | .............. 438/275 |
| 6,330,190 B1 | * | 12/2001 | Wang et al. | ........... 365/185.28 |
| 6,340,828 B1 | * | 1/2002 | Libera et al. | ................ 257/321 |
| 6,347,054 B1 | * | 2/2002 | Wang et al. | ........... 365/185.29 |
| 6,410,387 B1 | * | 6/2002 | Cappelletti et al. | ......... 438/257 |
| 6,525,970 B2 | * | 2/2003 | Wang et al. | ........... 365/185.29 |
| 2002/0127799 A1 | * | 9/2002 | Kim | .......................... 438/257 |
| 2002/0197800 A1 | * | 12/2002 | Hashimoto et al. | ......... 438/266 |
| 2003/0015753 A1 | * | 1/2003 | Clementi et al. | ........... 257/315 |

* cited by examiner

Primary Examiner—Long Pham
Assistant Examiner—Thao X. Le (57) ABSTRACT

A method of semiconductor integrated circuit fabrication. Specifically, one embodiment of the present invention discloses a method for reducing shallow trench isolation (STI) corner recess of silicon in order to reduce STI edge thinning for peripheral thin gate transistor devices 480 in an integrated circuit 400 comprising flash memory devices 380, and both thick 390 and thin 480 gate transistor devices. The method begins by forming a tunnel oxide layer 310 over a semiconductor substrate 430 for the formation of the flash memory devices 380 (step 220). A mask 350 is formed over the thin gate transistor devices 480 to inhibit formation of a thick gate oxide layer 360 for the formation of the thick gate transistor devices 390 (step 230). The mask 350 reduces shallow trench isolation (STI) recess by eliminating removal of the thick gate oxide layer 360 before forming a thin oxide layer 410 for the thin gate transistor devices 480.

22 Claims, 5 Drawing Sheets

METHOD FOR REDUCING SHALLOW TRENCH ISOLATION EDGE THINNING ON THIN GATE OXIDES TO IMPROVE PERIPHERAL TRANSISTOR RELIABILITY AND PERFORMANCE FOR HIGH PERFORMANCE FLASH MEMORY DEVICES

TECHNICAL FIELD

The present invention relates to the field of microelectronic integrated circuits. Specifically, the present invention relates to a process for reducing shallow trench isolation edge thinning on tunnel oxides for high performance flash memories.

BACKGROUND ART

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block. A memory of this type includes individual Metal-Oxide Semiconductor (MOS) memory cells, each of which includes a source, drain, floating gate and control gate to which various voltages are applied to program the cell with a binary 1 or 0, or erase all of the cells as a block. Flash memory is used in digital cellular phones, digital cameras, LAN switches, PC Cards for notebook computers, digital set-up boxes, embedded controllers, and other devices.

As flash memory technology progresses, the density of the memory cells, as well as, the speed of the flash memory increases. Device isolation is necessary in order to achieve higher cell densities. Without proper device isolation, local cells as well as peripheral devices will adversely interfere and interact with each other. Device isolation helps reduce parasitic conduction paths, series resistances, current leakage, and helps maintain threshold voltage control.

Shallow trench isolation (STI) is one technique for device isolation. The STI technique improves the scaling of devices in order to increase cell density throughout an integrated circuit. The formation of STI regions precedes the formation of a tunnel oxide layer of the flash memory devices during fabrication of the integrated circuit.

In one integrated circuit comprising flash memory devices and peripheral transistor devices, the peripheral transistors need to handle both high voltages (HV) and low voltages (LV) in order to control the core flash memory devices. The high voltage transistors are peripheral thick gate oxide transistors. The low voltage transistors are peripheral thin gate oxide transistors.

As technology improves, high performance low voltage transistors require thinner and thinner gate oxide layers. In the current process, the formation of the thin gate oxide layer for the low voltage transistors requires several etch and clean steps to remove pre-existent oxide and masking layers, such as the tunnel oxide layers associated with the flash memory devices, and the thick gate oxide layers for peripheral thick gate oxide transistors.

Figure 1:
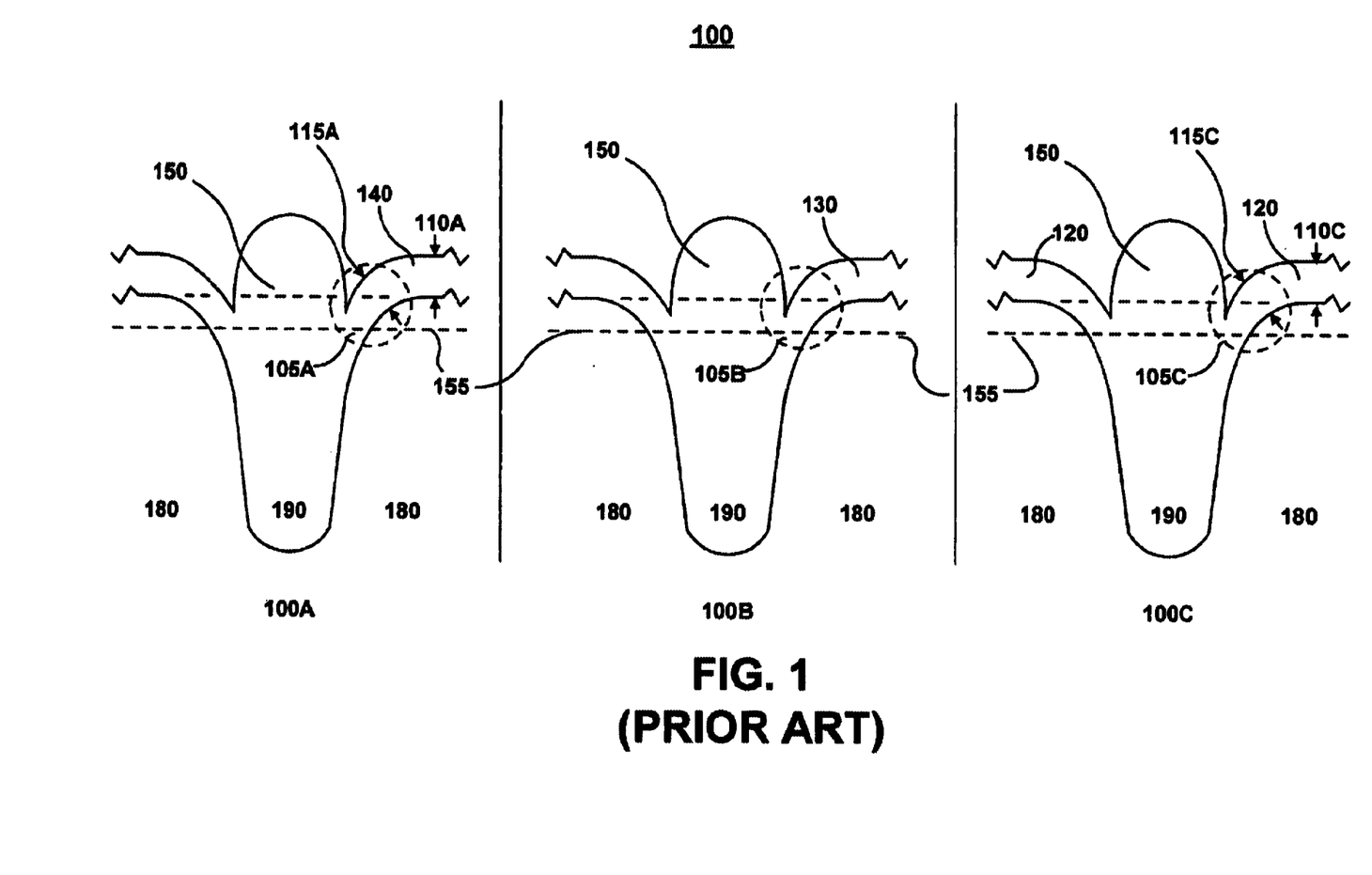

Prior Art FIG. 1 is a cross-sectional view of an integrated circuit comprising flash memory devices and peripheral thick and thin gate oxide transistors. Prior Art FIG. 1 illustrates three stages of fabrication for thin gate oxide transistors in the integrated circuit. The three stages of fabrication as illustrated are as follows: gate oxide (GATEOX) stage 100A for the formation of the tunnel oxide layer 140, GATEOX stage 100B for the formation of the thick gate oxide layer 130, and GATEOX stage 100C for the formation of the thin gate oxide layer 120.

The portions illustrated in the thin gate oxide transistor devices include an STI region 190 for separating devices within the integrated circuit. The STI region 190 of Prior Art FIG. 1 isolates two thin gate oxide transistor devices, located on either side of the STI region 190. Active regions 180 of the thin gate oxide transistor devices are shown and contain either the source or drain for the devices.

At the GATEOX stage 100A, a tunnel oxide layer 140 is formed on top of the active region 180 of the thin gate oxide transistor devices. Prior to tunnel oxide layer 140 formation, an overetch and clean process was performed to expose the silicon surface in the active areas 180 of the thin gate oxide transistors. The silicon surface of the transistor devices lies along line 150 in Prior Art FIG. 1.

As a result, a recess of the silicon surface along line 150 for each of the thin gate oxide transistor devices, as well as recess of the field oxide in the STI region 190, occurs. The recess of silicon, hereinafter referred to as "STI recess," is especially pronounced at the edges of the STI region (e.g., STI corner 105A, as indicated in shadow). The STI recess is more pronounced at STI corner 105A due to the increased slope of the silicon surface at the STI corner 105A, in comparison to the slope of the silicon surface that lies parallel and along line 150.

Furthermore, because of the overetch and clean process, STI recess leads to subsequent edge thinning of any oxide deposition, such as the tunnel oxide layer 140, at the STI corners. Reduced formation of subsequent oxide layers is also due to the increased slope of the silicon surface at the STI corner 105A. This is evidenced by the reduced deposition thickness 115A of tunnel oxide layer 140 at the STI corner 105A, as opposed to the thickness 110A of the tunnel oxide layer 140 at the surface of the silicon that is parallel with line 150.

Because the thin oxide transistor devices on either side of the STI region 190 are thin gate oxide devices, the tunnel oxide layer is removed in subsequent fabrication steps to facilitate the formation of a thin gate oxide layer 120.

However, subsequent overetching and cleaning steps due to the formation and removal of intermediate oxide layers lead to further STI recess in the STI corners 105A, 105B, and 105C. For example, at the GATEOX stage 100B, a thick gate oxide layer 130 is formed on top of the active region 180 of the thin gate oxide transistor devices. Prior to the thick gate oxide layer 130 formation, an overetch and clean process was performed to again expose the silicon surface in the active areas 180 of the thin gate oxide transistor in order to facilitate bonding between the silicon surface and the newly formed oxide layer. The silicon surface of the transistor devices lies along line 150 in Prior Art FIG. 1.

The GATEOX stage 100B of Prior Art FIG. 1 illustrates the further recess of silicon due to the overetching and cleaning performed prior to the formation of the thick gate oxide layer 130 in the STI corner 105B. The STI recess is more pronounced at GATEOX stage 100B, in comparison to GATEOX stage 100A, as the silicon surface in the STI corner 105B has a longer and more rounded surface leading to further edge thinning of later formed oxide layers. For example, the STI recess in the STI corner 1051B reaches down to the line 155 at GATEOX stage 100B, as opposed to the STI recess at GATEOX stage 100A, where the STI recess occurs more at the surface near line 150.

In order to form the thin gate oxide layer 120 on the thin gate oxide transistors located on either side of the STI region 190, a further overetching and cleaning leads again to further STI recess, as evidenced in the STI corner 105C of GATEOX stage 100C. The STI recess is most pronounced at GATEOX stage 100C, as the silicon surface in the STI corner 105C has the longest and most rounded surface. This leads to further edge thinning of subsequently formed thin gate oxide layer 120.

For example, the STI recess in the STI corner 105C at GATEOX stage 100C reaches down past the line 155, as opposed to the STI recess at GATEOX stage 100B, where the STI recess reaches only to line 155. The formation of the thin gate oxide layer at the STI corners is most adversely affected, as evidenced by the extreme thinning of the thin gate oxide layer 120 at the STI corner 105C. This is evidenced by the reduced deposition thickness 115C of thin gate oxide layer 120 at the STI corner 105C, as opposed to the thickness 110C of the thin gate oxide layer 140 at the surface of the silicon that is parallel with line 150.

The reduced edge thinning of the thin gate oxide layer 120 at the STI corner 105C may be tolerable when the layer 120 is about 70 Angstroms in thickness. However, edge thinning effects due to fabrication techniques in the prior art for the formation of thin gate oxide layer 120 with thicknesses of less than 35 Angstroms would be intolerable. Edge thinning for thin gate oxide layer 120 of 35 Angstroms or less would lead to thicknesses 115C of less than 10 Angstroms, which would reduce the reliability of the oxide layer 120, especially at the STI corner 105C, and lead to reduced device performance, etc. Furthermore, severe gate current leakage may occur due to the severe edge thinning occurring at the STI corner 105C.

Thus, a need exists for a fabrication technique that provides better distribution of a thin gate oxide layer on an integrated circuit supporting flash memory devices. A further need exists for a fabrication technique that provides reduced edge thinning at the STI corners for a thin gate oxide layer on a flash memory device.

DISCLOSURE OF THE INVENTION

The present invention provides a method of semiconductor structure fabrication wherein the method provides better distribution of a thin gate oxide layer for thin gate oxide transistors located on an integrated circuit supporting flash memory devices. Also, the present invention provides for a method of semiconductor fabrication that provides less thin gate oxide edge thinning at the shallow trench isolation (STI) corners of thin gate oxide transistor devices located on an integrated circuit supporting flash memory devices.

A method of semiconductor integrated circuit fabrication. Specifically, one embodiment of the present invention discloses a method for reducing shallow trench isolation (STI) corner recess of silicon in order to reduce STI edge thinning for peripheral thin gate transistor devices in an integrated circuit comprising flash memory devices, and both thick and thin gate transistor devices. The method begins by forming a tunnel oxide layer over a semiconductor substrate for the formation of the flash memory devices. A mask is formed over the thin gate transistor devices including the tunnel oxide layer to inhibit formation of a thick gate oxide layer for the formation of the thick gate transistor devices. The mask reduces shallow trench isolation (STI) recess by eliminating removal of the thick gate oxide layer before forming a thin oxide layer for the thin gate transistor devices.

BRIEF DESCRIPTION OF THE DRAWINGS

PRIOR ART FIG. 1 includes cross sectional views of a semiconductor substrate containing thin gate oxide transistors in an integrated circuit supporting flash memory devices illustrating the shallow trench isolation (STI) edge thinning of the thin gate oxide layer.

BEST MODES FOR CARRYING OUT THE INVENTION

Reference will now be made in detail to the preferred embodiments of the present invention, a method of semiconductor fabrication for reducing the shallow trench isolation (STI) edge thinning of thin gate oxides and for providing better distribution of the thin gate oxide layer at the STI corners of thin gate oxide transistors in semiconductor integrated circuits supporting flash memory devices. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a method of semiconductor structure fabrication wherein the method provides better distribution of a thin gate oxide layer on a thin gate oxide transistor device in an integrated circuit supporting flash memory devices. Also, the present invention provides for a method of semiconductor fabrication that provides less thin gate oxide edge thinning at the shallow trench isolation (STI) corners of thin gate oxide transistor devices in an integrated circuit supporting flash memory devices.

Figure 2:
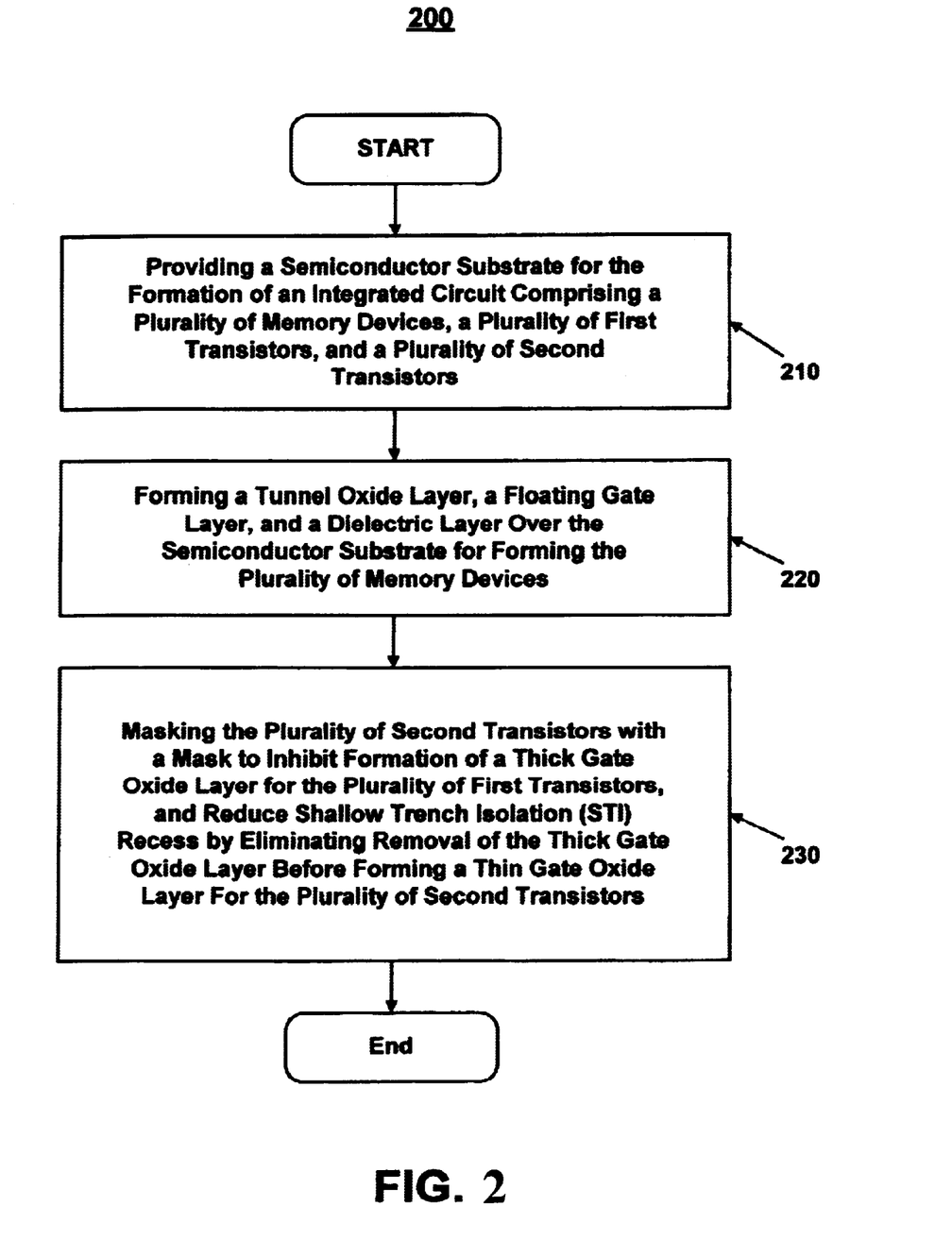
FIG. 2 is a flow diagram illustrating steps in a method of reducing STI edge thinning on thin gate oxides for integrated circuits comprising thin gate oxide transistor devices, thick gate oxide transistor devices, and high performance semiconductor flash memory devices, in accordance with one embodiment of the present invention.
Figure 3:
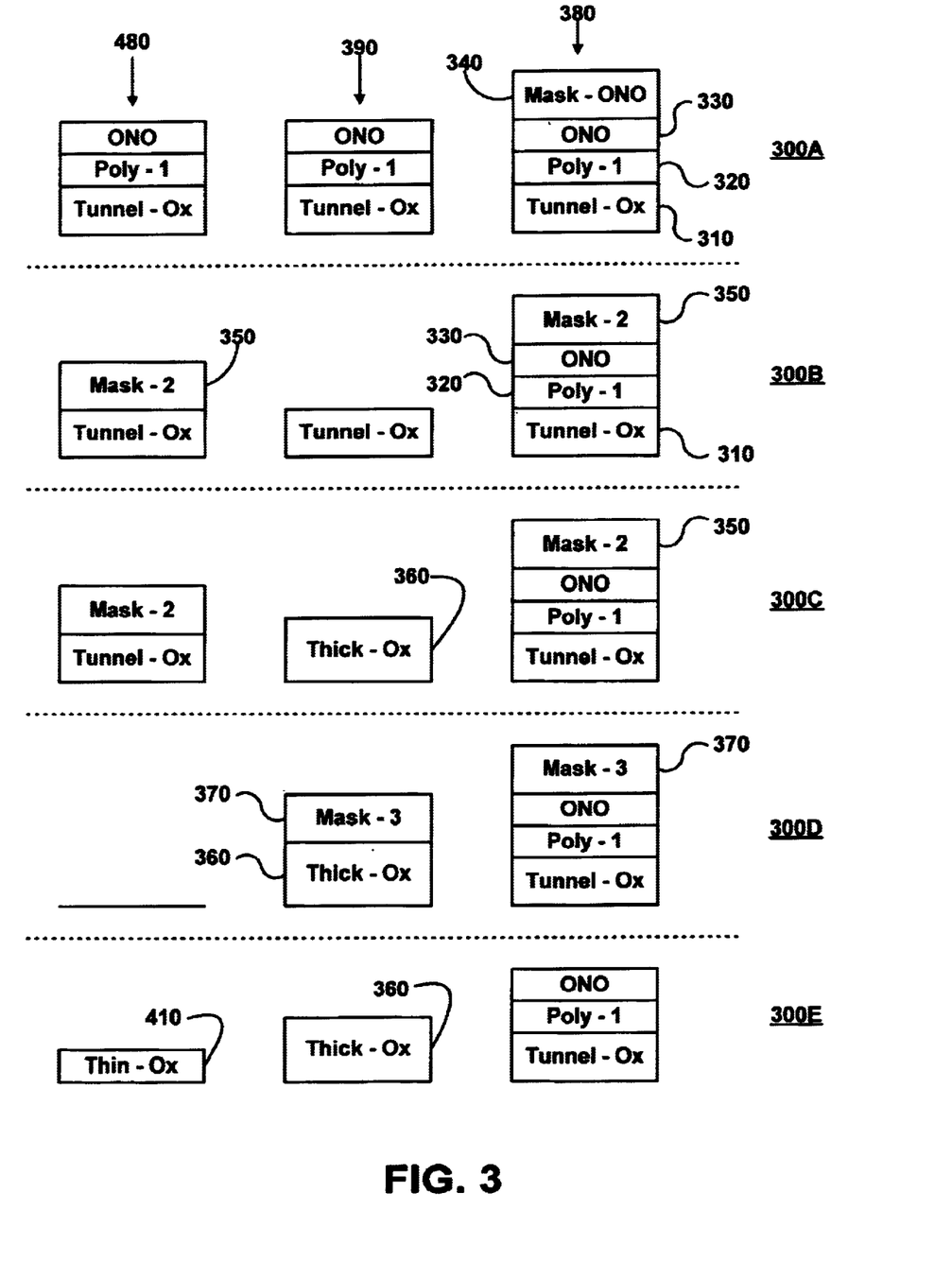
FIG. 3 is a diagram illustrating fabrication stages for the formation of an integrated circuit comprising thin gate oxide transistors, thick gate oxide transistors, and flash memory devices, in accordance with one embodiment of the present invention.
Figure 4:
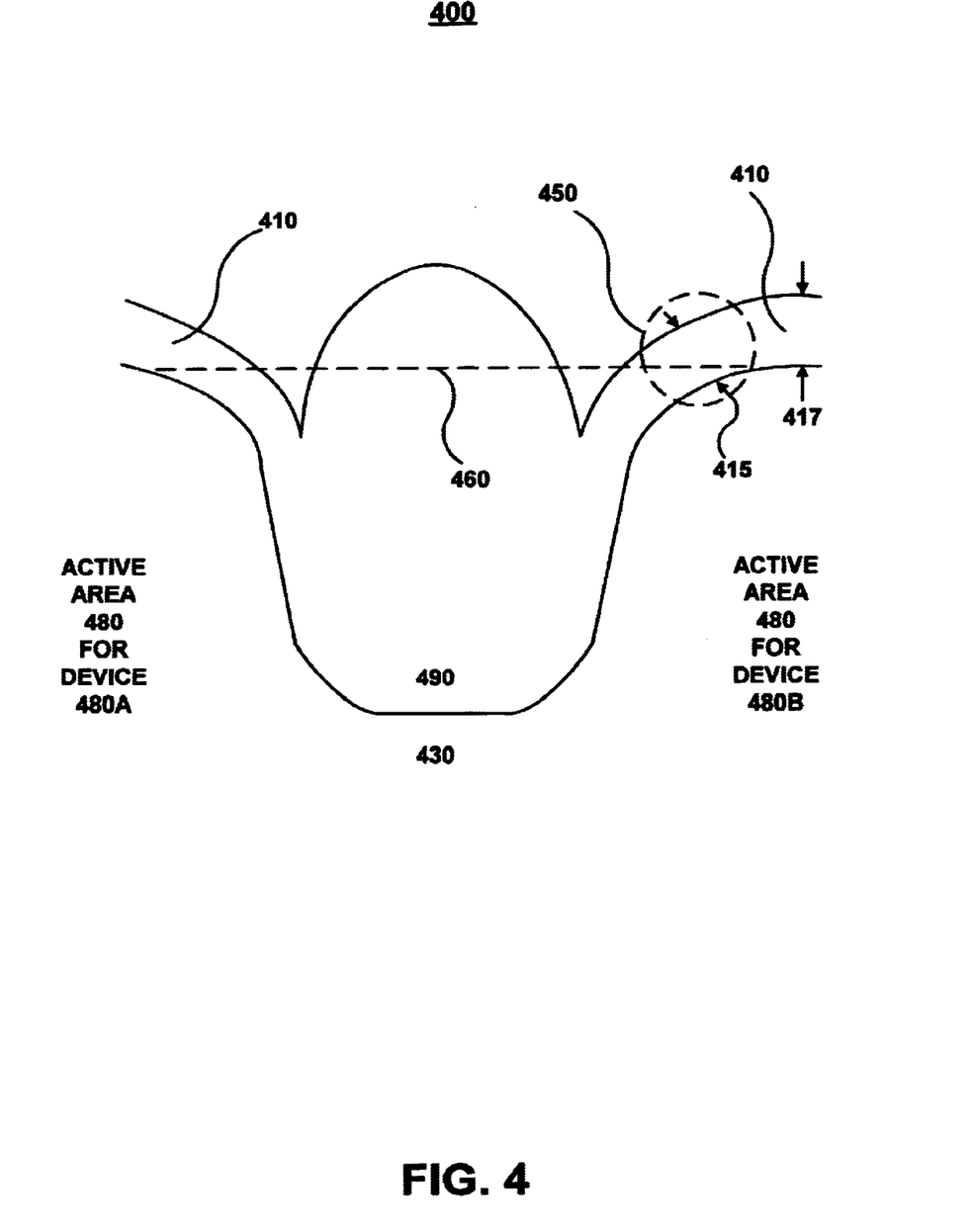
FIG. 4 is a cross sectional view of a thin gate oxide transistor device illustrating the reduced recess of silicon due to the elimination of the removal of a thick gate oxide layer before forming the thin gate oxide layer over the thin gate oxide transistors, in accordance with one embodiment of the present invention.
Figure 5:
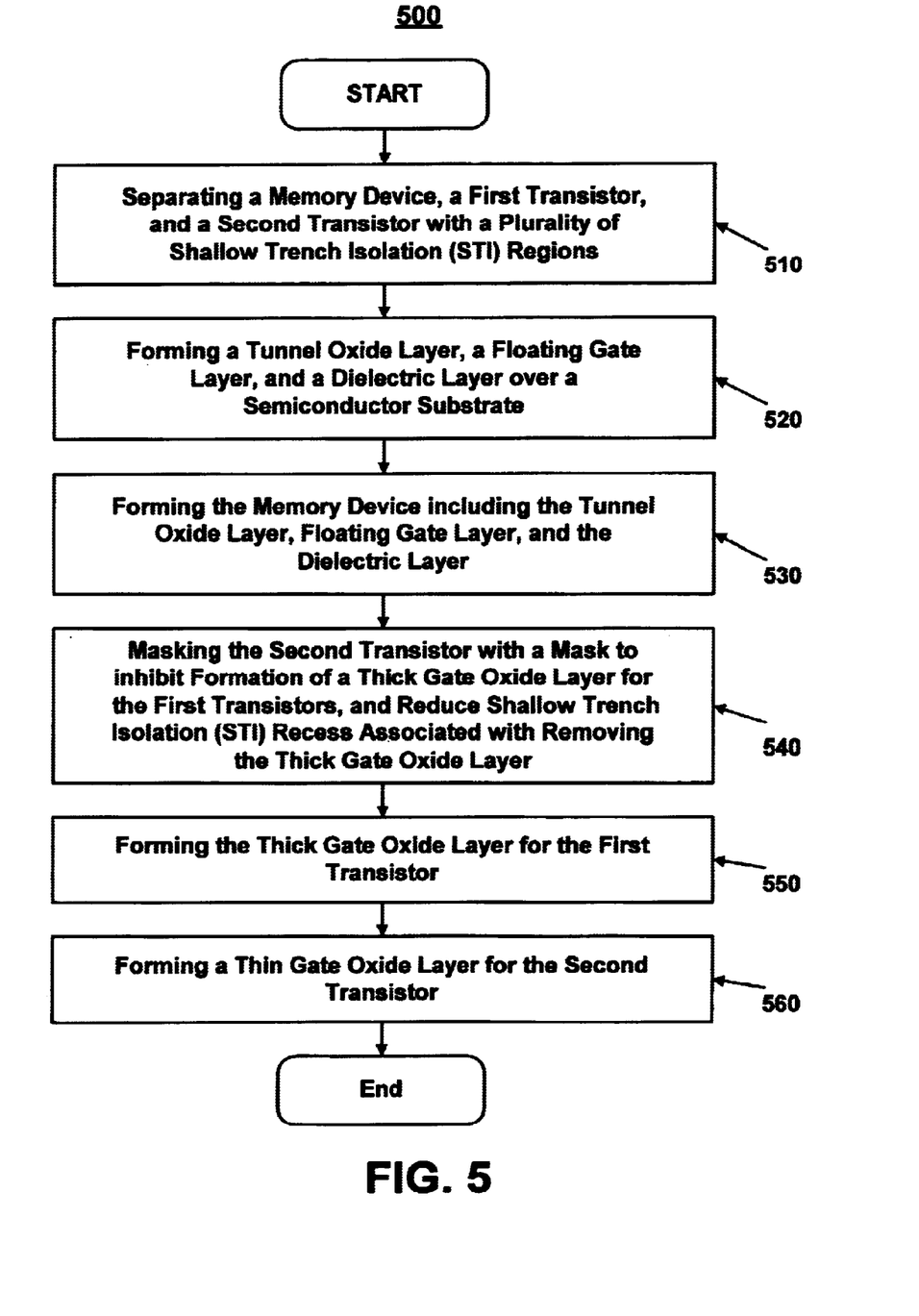
FIG. 5 is a flow diagram illustrating steps in a method of reducing STI edge thinning on thin gate oxides for integrated circuits comprising thin gate oxide transistor devices, thick gate oxide transistor devices, and high performance semiconductor flash memory devices, in accordance with one embodiment of the present invention.

The flow charts 200 and 500 of FIGS. 2 and 5, respectively, in combination with FIGS. 3 and 4 illustrate the fabrication of a semiconductor structure with reduced STI edge thinning of the thin gate oxide layer of thin gate oxide transistor devices in an integrated circuit supporting semiconductor flash memory devices.

Referring now to FIG. 2, the method of fabrication with reduced STI edge thinning for a thin gate oxide layer for the formation of a thin gate oxide transistor is disclosed, in accordance with one embodiment of the present invention. FIG. 2 provides a flow chart 200 of steps in the method of fabrication with reduced STI edge thinning in the formation of a thin gate oxide layer.

An improved process flow is disclosed in flow chart 200 in order to alleviate the edge thinning for a thin gate oxide layer (e.g., layer 410 of FIG. 4) by reducing the amount of oxide that is etched at each of the thin gate oxide transistor devices (480) before the formation of the thin gate oxide layer (410). The reduction in the etching of intermediate oxide layers can lead to reduced STI recess, improved oxidation formation at the STI corners with pronounced improvement in the reduction of edge thinning.

The present embodiment begins with providing a semiconductor substrate (e.g., substrate 430) for the formation of an integrated circuit comprising a plurality of memory devices, a plurality of first transistors, and a plurality of second transistors, in step 210. The plurality of first transistors is a plurality of thick gate oxide transistor devices for operation at higher voltages in order to the control the plurality of memory devices. The plurality of second transistors is a plurality of thin gate oxide transistor devices (480) for operation at lower voltages in order to control the plurality of memory devices. The thin gate oxide transistor devices (480) have a thin gate oxide layer (410) of an order approximating 35 Angstroms, or less. The thin and thick gate oxide transistors devices are located on an integrated circuit supporting a plurality of flash memory devices. Each of the devices on the integrated circuit are isolated from the other devices by an STI region.

Although the present embodiment is employed with thin and thick gate oxide transistors, as well as, flash memory devices for purposes of illustration, brevity, and clarity, it should be understood that other transistor devices, as well as, other memory devices could be employed in conjunction with the present invention.

In step 220, the present embodiment proceeds by forming a tunnel oxide layer, a floating gate layer, and a dielectric layer over the semiconductor substrate. Formation of these layers is necessary for the formation of the plurality of flash memory devices. It is appreciated that the steps provided in flow chart 200 is for the formation of each of the thin and thick gate transistor devices and the flash memory devices, and that the formation of each of the devices may not occur independently from the formation of the other devices.

The present embodiment achieves reduced edge thinning at the STI corners by protecting the thin gate oxide transistor area during the initial removal of the tunnel oxide for the formation of the thick gate oxide transistor devices, thus reducing the etching exposure. In essence, the removal of the tunnel oxide is delayed to a later step in the formation of the integrated circuit.

The present embodiment proceeds by masking the plurality of thin gate oxide transistors with a mask to inhibit formation of a thick gate oxide layer. The formation of the thick gate oxide layer is for the formation of the plurality of thick gate oxide transistors. Reduced STI recess is achieved by eliminating removal of the thick gate oxide layer before forming a thin oxide layer for the plurality of second transistors, since the thick gate oxide layer is not present.

FIG. 5 is a flow chart of steps 500 in combination with FIG. 3 illustrate a more detailed process flow for a method of fabrication with reduced STI edge thinning for a thin gate oxide layer (410) for the formation of a thin gate oxide transistor (480), in accordance with one embodiment of the present invention. FIG. 3 illustrates various stages of formation of a thin gate oxide transistor 480, a thick gate oxide transistor 390, and the flash memory device 380, in accordance with another embodiment of the present invention.

In step 510, the present embodiment begins by separating a memory device, a first transistor, and a second transistor with a plurality of STI regions (490) in a semiconductor substrate (e.g., semiconductor substrate 430 of FIG. 4). The memory device is a flash memory device 380, the first transistor is a thick gate oxide transistor device 390, and the second transistor is a thin gate oxide transistor device 480, as illustrated in FIG. 3.

As stated previously, although the present embodiment is employed with thin and thick gate oxide transistors, as well as, a flash memory device for purposes of illustration, brevity, and clarity, it should be understood that other transistor devices, as well as, other memory devices could be employed in conjunction with the present invention.

In step 520, the present embodiment proceeds by forming a tunnel oxide layer (310), a floating gate layer (320), and a dielectric layer (330) over a semiconductor substrate 430 for the thin gate oxide transistor device 480, thick gate oxide transistor 390, and the flash memory device 380.

In step 530, the present embodiment proceeds by forming the flash memory device 380. At this stage, the flash memory device 380 is formed including a tunnel oxide layer 310 (of an approximate thickness of 100 Angstroms), a polysilicon floating gate layer 320 (of a thickness approximately between 500 to 900 Angstroms) (hereinafter referred to as poly-1 floating gate layer 320), and the dielectric layer 330, such as Oxide-Nitride-Oxide (ONO). The dielectric layer 330 serves to insulate the poly-1 floating gate layer 320 from a later formed control gate (not shown).

Formation of the flash memory device 380 in step 530 includes masking the flash memory device 380 with a ONO mask 340 as illustrated in formation stage 300A of FIG. 3. The ONO mask serves to protect the already formed layers of the flash memory device 380 from subsequent etch and clean steps. Thereafter, the poly-1 floating gate layer 320, as well as, the ONO layer 330 are removed from the thick gate oxide transistor device 390 and the thin gate oxide transistor device 480. Lastly, the ONO mask 340 is removed in another etch and clean step prior to the subsequent oxide formations.

In step 540, the present embodiment masks the thin gate oxide transistor device with a second mask (Mask-2) 350 to inhibit formation of a thick gate oxide layer 360 associated with forming the thick gate oxide transistor device 390, as illustrate in formation stage 300B of FIG. 2. The mask-2 350 also serves to reduce STI recess associated with removing the thick gate oxide layer 360 over the thin gate oxide transistor 480 before formation of the thin gate oxide layer 410.

Included within step 540, the present embodiment proceeds by also masking the flash memory device 380 with the mask-2 to protect the flash memory device 380 from subsequent etch and clean steps. Instead of creating a new mask, mask-2 350 can be created by modifying the ONO mask 340, in one embodiment, in order to reduce the cost of fabrication.

In step 550 of flow chart 500, the present embodiment proceeds by forming the thick gate oxide layer 360 for the thick gate oxide transistor 390. Included within step 550, the present embodiment removes the tunnel oxide layer 310 over the thick gate transistor 390 with an etch and clean process, as illustrated in fabrication stage 300C of FIG. 3. Subsequently, the mask-2 350 is removed before forming the thick gate oxide layer 360 through oxidation. The exposure of the integrated circuit 400 to oxidation to form the thick gate oxide layer 360 is isolated mainly over the thick gate oxide transistor 390 since the thin gate transistor 480 and the flash memory device 380 have exposed oxide layers exhibiting limited reaction to the process of oxidation.

In step 560, the present embodiment proceeds by forming a thin gate oxide layer 410 for the thin gate oxide transistor device 480. Included within step 560, the present embodiment proceeds by masking the thick gate transistor device 390 and the flash memory device 380 with a third mask (mask-3) 370, as illustrated in formation stage 300D in FIG. 3. The present embodiment then etches and cleans to remove the previously formed tunnel oxide layer 310 over the thin gate oxide transistor 480, as illustrated in formation stage 300E.

Subsequently, the mask-3 370 is removed by an etching and cleaning process before forming the thin gate oxide layer 410 through oxidation. The exposure of the integrated circuit 400 to oxidation to form the thin gate oxide layer 410 is isolated mainly over the thin gate oxide transistor 480 since the thick gate oxide transistor 390 and the flash memory device 380 have exposed oxide layers exhibiting limited reaction to the process of oxidation. FIG. 3 at formation stage 300E illustrates the beginning formation of each of the thin gate oxide transistors 480, thick gate oxide transistors 390, and flash memory devices 380. Further fabrication steps are necessary to complete the formation of the thin 480 and thick 390 gate oxide transistors, and the flash memory devices 380.

As a result, the thin gate oxide layer 410 exhibits reduced edge thinning at the STI corners due to the elimination of exposure to a clean and etch step to remove the thick gate oxide layer 360 formation and various removal of masking formations. The reduced oxide etch (from about 250 Angstroms down to about 100 Angstroms) can lead to reduced STI recess, and reduced edge thinning of the thin gate oxide layer 410 at the STI corners (e.g., STI corner 450). FIG. 4 is a diagram of a cross section of an integrated circuit 400 comprising thick gate oxide transistors (not shown) and thin gate oxide transistors 480A and 480B, all of which support flash memory devices (not shown). Thin gate oxide transistors 480A and 480B are representative of the thin gate oxide transistor 480 of FIG. 3.

Because of the masking scheme employed with mask-2 350, the silicon surface above the active areas 480 of the thin gate oxide transistor devices has not been previously exposed to any clean and etch process for the removal of any thick gate oxide layer 360. The reduced oxide etch is targeted to reduce the STI recess before the thin gate oxide layer 410 formation. This results in improved oxidation of the thin gate oxide layer 410 in the region of the STI corner 415, which lies along a different crystal direction from the silicon surface that lies parallel to and along line 460. The oxide thickness 415 at the STI corner 450 can thus become more comparable to the thickness 417 in the active area 480 that lies mostly parallel with line 460.

Furthermore, the proposed process illustrated in flow charts 200 and 500 have no major impact on the current flash memory fabrication process. The improvement of masking the thin gate oxide transistor devices with a mask to protect from thick gate oxide formation and thereby eliminating its subsequent removal before formation of a thin gate oxide layer 410, can be easily integrated into the standard process flow of fabrication.

The preferred embodiment of the present invention, a method for semiconductor fabrication with reduced edge thinning of thin gate oxide layers for thin gate oxide transistors in an integrated circuit supporting high performance flash memory devices, is thus described. While the present invention has been described in particular embodiments, it should be appreciated that the present invention should not be construed as limited by such embodiments, but rather construed according to the below claims.

What is claimed is:

1. A method of semiconductor structure fabrication comprising:
   a) providing a semiconductor substrate 430 for the formation of an integrated circuit 400 comprising a plurality of memory devices 380, a plurality of first transistors 390, and a plurality of second transistors 480 (step 210);
   b) forming a tunnel oxide layer 310, a floating gate layer 320, and a dielectric layer 330 over said semiconductor substrate 430 for forming said plurality of memory devices 380 (step 220);
   c) masking said plurality of second transistors 480 with a mask 350 to inhibit formation of a thick gate oxide layer 360 for said plurality of first transistors 390, and reduce shallow trench isolation (STI) recess by eliminating removal of said thick gate oxide layer 360 before forming a thin gate oxide layer 410 for said plurality of second transistors 480 (step 230).

2. The method of semiconductor structure fabrication as described in claim 1, wherein b) further comprises:
   b1) masking said plurality of memory devices 380 with a second mask 340;
   b2) removing said floating gate layer 320 and said dielectric layer 330 over said plurality of first transistors 390 and said plurality of second transistors 480; and
   b3) removing said second mask 340.

3. The method of semiconductor structure fabrication as described in claim 2, further comprising:
   creating said mask 350 without removing said second mask 340 by modifying said second mask 340.

4. The method of semiconductor structure fabrication as described in claim 1, wherein c) further comprises:
   c1) masking said plurality of memory devices 380 with said mask 350;
   c2) removing said tunnel oxide layer 310 over said plurality of first transistors 390;
   c3) removing said mask 350; and
   c4) forming said thick gate oxide layer 360 over said plurality of first transistors 390.

5. The method of semiconductor structure fabrication as described in claim 4, further comprising:
   d) masking said plurality of first transistors 390 and said memory devices 380 with a second mask 370;
   e) removing said tunnel oxide layer 310 over said plurality of second transistors 480;
   f) removing said second mask 370; and
   g) forming said thin gate oxide layer 410 over said plurality of second transistors 480.

6. The method of semiconductor structure fabrication as described in claim 1, wherein each of said plurality of memory devices 380 is a flash memory device.

7. The method of semiconductor structure fabrication as described in claim 1, wherein each of said plurality of first transistors 390 is a thick gate oxide transistor for high voltage operation.

8. The method of semiconductor structure fabrication as described in claim 1, wherein each of said plurality of second transistors 480 is a thin gate oxide transistor for low voltage operation.

9. A method of semiconductor structure fabrication comprising:
   a) forming a tunnel oxide layer 310, a floating gate layer 320, and a dielectric layer 330 over a semiconductor substrate 430 for a first transistor 390, a second transistor 480, and a memory device 380 (step 520;
   b) forming said memory device 380 having said tunnel oxide layer 310, said floating gate layer 320, and said dielectric layer 330 (step 530);
   c) masking said second transistor 480 with a mask 350 to inhibit formation of a thick gate oxide layer 360 and to reduce shallow trench isolation (STI) recess associated with removing said thick gate oxide layer 360 (step 540);
   d) forming said thick gate oxide layer 360 for said first transistor 390 (step 550); and
   e) forming a thin gate oxide layer 410 for said second transistor 480 with reduced STI recess (step 560), wherein e) further comprises:
      e1) masking said first transistor 390 and said memory device 380 with a second mask 370;
      e2) removing said tunnel oxide layer 310;
      e3) removing said second mask 370; and
      e4) forming said thin gate oxide layer 410 over said second transistor 480.

10. The method of semiconductor structure fabrication as described in claim 9, wherein b) comprises:
   b1) masking said memory device 380 with a second mask 340;
   b2) removing said floating gate layer 320 and said dielectric layer 330 over said first 390 and second 480 transistors; and
   b3) removing said second mask 340.

11. The method of semiconductor structure fabrication as described in claim 10, wherein c) further comprises:
   creating said mask 350 without removing said second mask 340 by modifying said second mask 340.

12. The method of semiconductor structure fabrication as described in claim 9, wherein d) comprises:
   d1) masking said memory device 380 with said mask 350;
   d2) removing said tunnel oxide layer 310 over said first transistor 390;
   d3) removing said mask 350; and
   d4) forming said thick gate oxide layer 360 over said first transistor 390.

13. The method of semiconductor structure fabrication as described in claim 9, wherein said memory device 380 is a flash memory device, said first transistor 390 is a thick gate transistor, and said second transistor 480 is a thin gate transistor.

14. The method of semiconductor structure fabrication as described in claim 9, further comprising:
   separating said first transistor 390, said second transistor 480, and said memory device 380 with a plurality of STI regions 490, said separating performed before a) (step 510).

15. A method of semiconductor structure fabrication comprising:
   a) separating a memory device 380, a first transistor 380, and a second transistor 480 with a plurality of shallow trench isolation (STI) regions 490 (step 510);
   b) forming a tunnel oxide layer 310 for an integrated circuit 400 comprising said memory device 380, said first transistor 390, and said second transistor 480 (step 520); and
   c) reducing STI recess in said second transistor 480 by masking said second transistor 480 having said tunnel oxide layer 310 with a mask 350 to inhibit formation of a thick gate oxide layer 360 for said first transistor 390 to eliminate removal of said thick gate oxide layer 360 before forming a thin gate oxide layer 410 for said second transistor 480 (step 540).

16. The method of semiconductor structure fabrication as described in claim 15, wherein b) further comprises:
   b1) forming a floating gate layer 320 and a dielectric layer 330 over said tunnel oxide layer 310 (step 520);
   b2) masking said memory device 380 with a second mask 340;
   b3) removing said floating gate layer 320 and said dielectric layer 330 over said tunnel oxide layer 310 over said first 390 and second transistor 480; and
   b4) removing said second mask 340, wherein said b1) through b4) are performed before c).

17. The method of semiconductor structure fabrication as described in claim 15, wherein c) further comprises:
   c1) masking said memory device 380 with said mask 350 (step 550);
   c2) removing said tunnel oxide layer 310 over said first transistor 390 (step 550);
   c3) removing said mask 350 (step 550); and
   c4) forming said thick gate oxide layer 360 over said first transistor 390 (step 550).

18. The method of semiconductor structure fabrication as described in claim 17, further comprising:
   d) masking said first transistor 390 and said memory device 380 with a second mask 370 (step 560);
   e) removing said tunnel oxide layer 310 over said second transistor 480 (step 560);
   f) removing said second mask 370 (step 560); and
   g) forming said thin gate oxide layer 410 over said second transistor 480 (step 560).

19. The method of semiconductor structure fabrication as described in claim 15, wherein a thickness of said thin gate oxide layer 410 is less than 35 Angstroms.

20. The method of semiconductor structure fabrication as described in claim 15, wherein said memory device 380 is a flash memory device, said first transistor 390 is a thick gate oxide transistor, and said second transistor 480 is a thin gate oxide transistor.

21. A method of semiconductor structure fabrication comprising:
   a) providing a semiconductor substrate 430 for the formation of an integrated circuit 400 comprising a plurality of memory devices 380, a plurality of first transistors 390, and a plurality of second transistors 480 (step 210);
   b) forming a tunnel oxide layer 310, a floating gate layer 320, and a dielectric layer 330 over said semiconductor substrate 430 for forming said plurality of memory devices 380 (step 220);

c) masking said plurality of second transistors 480 with a mask 350 to inhibit formation of a thick gate oxide layer 360 for said plurality of first transistors 390, and reduce shallow trench isolation (STI) recess by eliminating removal of said thick gate oxide layer 360 before forming a thin gate oxide layer 410 for said plurality of second transistors 480 (step 230), wherein c) further comprises:

c1) masking said plurality of memory devices 380 with said mask 350;

c2) removing said tunnel oxide layer 310 over said plurality of first transistors 390;

c3) removing said mask 350; and c4) forming said thick gate oxide layer 360 over said plurality of first transistors 390;

d) masking said plurality of first transistors 390 and said memory devices 380 with a second mask 370;

e) removing said tunnel oxide layer 310 over said plurality of second transistors 480;

f) removing said second mask 370; and g) forming said thin gate oxide layer 410 over said plurality of second transistors 480.

22. A method of semiconductor structure fabrication comprising:

a) separating a memory device 380, a first transistor 380, and a second transistor 480 with a plurality of shallow trench isolation (STI) regions 490 (step 510);

b) forming a tunnel oxide layer 310 for an integrated circuit 400 comprising said memory device 380, said first transistor 390, and said second transistor 480 (step 520); and  c) reducing STI recess in said second transistor 480 by masking said second transistor 480 having said tunnel oxide layer 310 with a mask 350 to inhibit formation of a thick gate oxide layer 360 for said first transistor 390 to eliminate removal of said thick gate oxide layer 360 before forming a thin gate oxide layer 410 for said second transistor 480 (step 540), wherein c) further comprises:

c1) masking said memory device 380 with said mask 350 (step 550);

c2) removing said tunnel oxide layer 310 over said first transistor 390 (step 550);

c3) removing said mask 350 (step 550); and c4) forming said thick gate oxide layer 360 over said first transistor 390 (step 550);

d) masking said first transistor 390 and said memory device 380 with a second mask 370 (step 560);

e) removing said tunnel oxide layer 310 over said second transistor 480 (step 560);

f) removing said second mask 370 (step 560); and g) forming said thin gate oxide layer 410 over said second transistor 480 (step 560).

\* \* \* \* \*